United States Patent
Li et al.

(10) Patent No.: US 11,892,511 B2
(45) Date of Patent: Feb. 6, 2024

(54) INTEGRATED MSD CONNECTOR TEST DEVICE FOR POWER BATTERY TEST

(71) Applicant: Shanghai Volvo Car Research and Development Co., Ltd., Shanghai (CN)

(72) Inventors: Mingbo Li, Shanghai (CN); Xinfeng Chen, Shanghai (CN)

(73) Assignee: Shanghai Volvo Car Research and Development Co., Ltd., Shanghai (CN)

( * ) Notice: Subject to any disclaimer, the term of this patent is extended or adjusted under 35 U.S.C. 154(b) by 460 days.

(21) Appl. No.: 17/037,821

(22) Filed: Sep. 30, 2020

(65) Prior Publication Data

US 2021/0123974 A1    Apr. 29, 2021

(30) Foreign Application Priority Data

Oct. 25, 2019 (CN) .......................... 201911023097.7

(51) Int. Cl.
    *G01R 31/364*      (2019.01)
    *G01R 31/392*      (2019.01)
    *G01R 31/36*      (2020.01)

(52) U.S. Cl.
    CPC ....... *G01R 31/364* (2019.01); *G01R 31/3644* (2013.01); *G01R 31/392* (2019.01)

(58) Field of Classification Search
None
See application file for complete search history.

(56) References Cited

U.S. PATENT DOCUMENTS

| | | | |
|---|---|---|---|
| 2002/0114117 A1 | 8/2002 | Milanczak | |
| 2005/0264296 A1* | 12/2005 | Philbrook | G01R 31/385 324/433 |
| 2014/0079981 A1* | 3/2014 | Sheen | H01M 50/552 264/272.21 |
| 2014/0193990 A1* | 7/2014 | Zhao | H01R 13/713 439/160 |
| 2015/0061413 A1* | 3/2015 | Janarthanam | H01M 50/271 307/328 |
| 2016/0049761 A1 | 2/2016 | Butcher et al. | |
| 2017/0179548 A1* | 6/2017 | Lee | H01H 85/10 |

FOREIGN PATENT DOCUMENTS

CN      107887536 A      4/2018

OTHER PUBLICATIONS

Feb. 19, 2021 European Search Report issued on International Application No. 20199497.

* cited by examiner

*Primary Examiner* — Nasima Monsur
(74) *Attorney, Agent, or Firm* — Clements Bernard Walker; Christopher L. Bernard

(57) ABSTRACT

An integrated MSD connector test device including: a housing; an MSD connector housed in the housing and having a first polarity contact and a second polarity contact, wherein the second polarity contact includes two contact portions separated from each other; a cable extending at least partially outside of the housing, two ends of the cable being electrically connected to the two contact portions respectively; and a first polarity port and a second polarity port accessible from outside of the housing, the first polarity port being electrically connected to the first polarity contact, and the second polarity port being electrically connected to one of the contact portions, wherein the first polarity is a positive or negative, and correspondingly, the second polarity is a negative or positive.

18 Claims, 3 Drawing Sheets

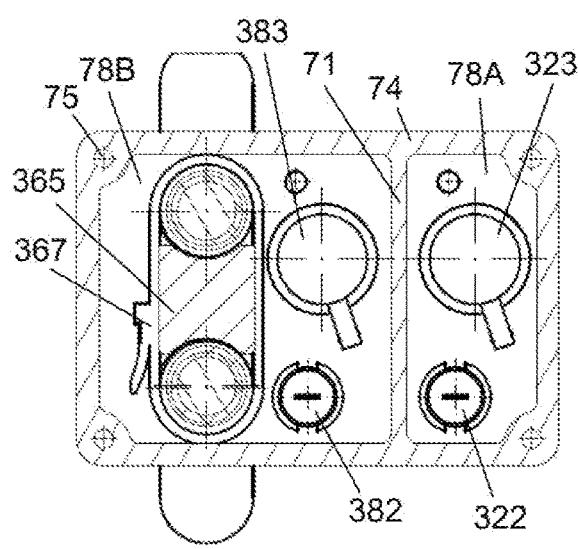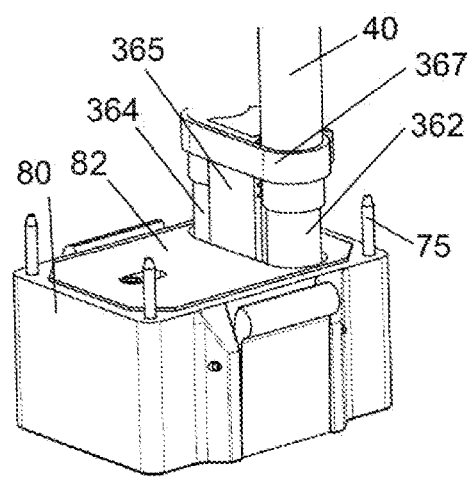
Figure 5
Figure 6
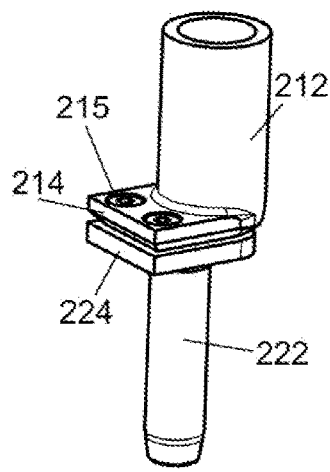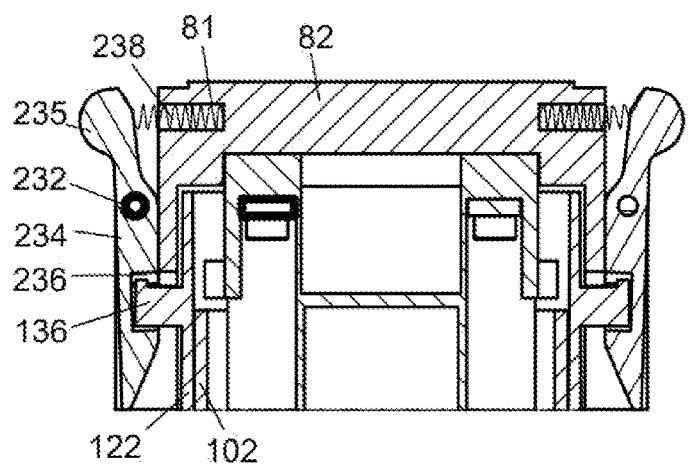
Figure 7
Figure 8
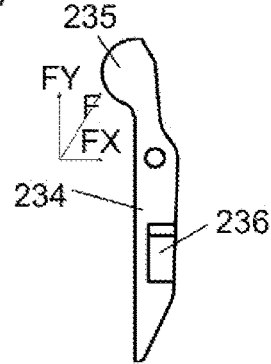
Figure 9

INTEGRATED MSD CONNECTOR TEST DEVICE FOR POWER BATTERY TEST

CROSS-REFERENCE TO RELATED APPLICATION

This disclosure claims priority to the Chinese patent application 201911023097.7, filed on Oct. 25, 2019, which is incorporated herein in its entirety by reference.

TECHNICAL FIELD

The present disclosure relates to the field of power battery test, and in particular to an integrated MSD connector test device for power battery test.

BACKGROUND

To cope with the worldwide energy crisis and to ease the global environmental pollution problems, the new energy automobile industry is growing fast. One of the focuses of the new energy automobile industry is the electric vehicles, which are valued and embraced by the transportation and energy sectors given their reduced energy consumption, smaller environmental impact and pollution-free nature. The key components of the electric vehicles are the power batteries configured to power the electric vehicles.

Measurement of the output voltage and current of the power battery is required for evaluating performance and behavior of the power battery under various working conditions. The power battery outputs a DC power generally having a voltage up to 400V and a current up to 250 A.

However, for safety reasons, the power battery installed in the vehicle is designed to have no test interfaces for current and voltage measurements. Therefore, dedicated test equipment need to be designed by engineers for measuring the voltage and current of the power battery. Usually, the MSD ("Manual Service Disconnect") connector of the power battery is modified to extend its electrical interfaces out for the power battery test.

A common modification to the MSD connector is to form a hole directly in the housing of the battery MSD connector, and to extend the conductive wires and test ports out through the hole. However, the MSD connector has a limited space, and only a main cable with small diameter is allowed to be used for testing the current, which is not suitable for high current applications having up to 250 A current. Besides, the housing of the MSD connector is not strong enough to withstand long-term stress caused by an external conductive wire having big diameter. If broken, the housing could easily injure the operator. The test ports that are exposed outside the housing also have no fuse. When there is a short circuit, the test ports could electrically shock the operator.

Another common modification is to redesign the MSD connector itself and to replace the original MSD connector with the redesigned connector. For the redesign, commonly, the cable is extended out for current test of the power battery, and, a separate cable is extended out from the connector to be electrically connected to a separate voltage test device for voltage test. However, this is not an integrated design and has two separate components, and thus is not convenient to carry around by the engineers. Injury risks are still high when the cable connecting the connector and the voltage test device is broken and pulled out.

The present disclosure solves at least one of the above technical problems.

SUMMARY

To address the technical problems identified above, in the present disclosure, an MSD connector of a power battery is modified to form an integrated MSD connector test device including the MSD connector, the test device being configured for basic tests on the power battery, including at least measuring the output current and the output voltage of the power battery.

A first aspect of the disclosure provides an integrated MSD connector test device, including: a housing; an MSD connector housed in the housing and having a first polarity contact and a second polarity contact, wherein the second polarity contact includes two contact portions separated from each other; a cable extending at least partially outside of the housing, two ends of the cable being electrically connected to the two contact portions respectively; and a first polarity port and a second polarity port accessible from outside of the housing, the first polarity port being electrically connected to the first polarity contact, and the second polarity port being electrically connected to one of the contact portions, wherein the first polarity is a positive or negative, and correspondingly, the second polarity is a negative or positive.

According to an embodiment, the integrated MSD connector test device further includes a first polarity external terminal and a second polarity external terminal housed in the housing, wherein: the first polarity external terminal is electrically connected between the first polarity contact and the first polarity port so that the two are electrically connected to each other, and the second polarity external terminal is electrically connected between the one of the contact portions and the second polarity port so that the two are electrically connected to each other.

According to an embodiment, one or more fuses are provided between the first polarity port and the first polarity external terminal and between the second polarity port and the second polarity external terminal respectively.

According to an embodiment, the integrated MSD connector test device further includes one or more fuse holders that house the respective fuses, the fuse holders being at least partially exposed outside of the housing.

According to an embodiment, the housing includes an upper housing and a lower housing detachably connected to each other and the MSD connector is housed in and fastened to the lower housing.

According to an embodiment, an electrical connection between the first polarity external terminal and the first polarity contact and an electrical connection between the second polarity external terminal and the respective contact portion are within the lower housing.

According to an embodiment, the first polarity external terminal and the second polarity external terminal extend from the lower housing into the upper housing, a first polarity conductive wire and a second polarity conductive wire are located in the upper housing, and the first polarity port, the second polarity port and the fuses at least partially extend out from the upper housing to the outside.

According to an embodiment, an insulating block is interposed in the housing and is configured to engage and secure the cable in the housing.

According to an embodiment, the insulating block includes a toothed structure for engaging an outer surface of the cable.

According to an embodiment, the integrated MSD connector test device further includes a binding structure that secures the cable to the insulating block.

According to an embodiment, the binding structure is a strap.

According to an embodiment, the upper housing includes a partition that defines a first space portion for the first polarity and a second space portion for the second polarity that is spaced apart from the first space portion, and wherein the first polarity external terminal, the first polarity port, and the fuse therebetween are placed in the first space portion, and the second polarity external terminal, the second polarity port and the fuse therebetween are placed in the second space portion.

According to an embodiment, an electrical connection between the first polarity external terminal and the first polarity contact and an electrical connection between the second polarity external terminal and the corresponding contact portion are achieved by one or more of: bolting, welding, riveting, interference fit and crimping.

According to an embodiment, the first polarity external terminal and the first polarity contact each include a plate-shaped connecting portion, and these plate-shaped connecting portions are bolted and welded together; and the second polarity external terminal and the corresponding contact portion each include a plate-shaped connecting portion, and these plate-shaped connecting portions are bolted and welded together.

According to an embodiment, the integrated MSD connector test device further includes a locking feature for releasably securing the integrated MSD connector test device to an MSD socket.

According to an embodiment, the locking feature is a protrusion or recess formed on the lower housing of the integrated MSD connector test device, which is configured for engaging a recess or a projection formed on the MSD socket.

According to an embodiment, the integrated MSD connector test device further includes a pivot shaft supported by the lower housing, a pivot member pivotable around the pivot shaft, and a resilient member positioned between an actuation end of the pivot member and the lower housing, wherein the protrusion or recess is disposed on the pivot member, and the protrusion or recess is configured to engage the recess or protrusion on the MSD socket when the resilient member is in an uncompressed state.

According to an embodiment, the pivot member includes the pivot member includes an out-protruding portion at its actuation end.

In the integrated MSD connector test device according to the present disclosure, one of the positive and negative contacts is provided as two separate contact portions which are electrically connected to the main cable via two external terminal assemblies. The current in the main cable can be measured using the current clamp, and thus the output current of the power battery can be measured conveniently. The positive and negative contacts of the MSD connector test device are electrically connected to the positive and negative ports via the positive and negative port conductive wires, respectively, so that the voltage between the positive and negative contacts of the MSD connector test device, which is the output voltage of the power battery, can be measured using the voltmeter which is electrically connected between the positive and negative ports. The fuses respectively provided for the positive and negative port conductive wires can disconnect the positive and negative contacts of the MSD connector test device and protect the operator when there is a short circuit.

BRIEF DESCRIPTION OF THE DRAWINGS

The above and other objects and advantages of the present disclosure will be more readily understood for the skilled in the art from the following description in combination with the appended drawings. In the drawings:

FIG. 5 is a cross-sectional view taken along a line D-D of FIG. 4;

FIG. 6 is another perspective view of the MSD connector test device with the upper housing and associated components removed;

FIG. 7 is a structural view showing an electrical connection of an external terminal of the MSD connector test device to a corresponding contact of the MSD connector;

FIG. 8 is a schematic view showing that the MSD connector test device is mounted to a vehicle-boarded MSD socket according to the present disclosure; and FIG. 9 is a view of a pivot member that connects the integrated MSD connector test device to the MSD socket.

DETAILED DESCRIPTION OF EMBODIMENTS

The present disclosure is designed for testing basic parameters of a power battery by modifying the MSD connector of the power battery, where the term "basic parameters" include, but are not limited to, an output current and an output voltage of the power battery.

The present disclosure is to provide an integrated MSD connector test device that integrates an original MSD connector and all components required for testing the basic parameters of the power battery. Only the following parts are exposed outside of the test device: a main cable required for testing the output current of the power battery, the test ports for testing the output voltage of the power battery, and a fuse for providing protection when there is a short circuit due to mis-operation of the operator or other unexpected issues. These exposed parts allow the operator to test the basic parameters of the power battery and at the same time provide necessary protection for the operator. The integrated MSD connector test device thus provides all functions of the original MSD connector, enables testing the basic parameters of the power battery, has an integrated structure and a small footprint and is easy to carry around.

Figure 1:
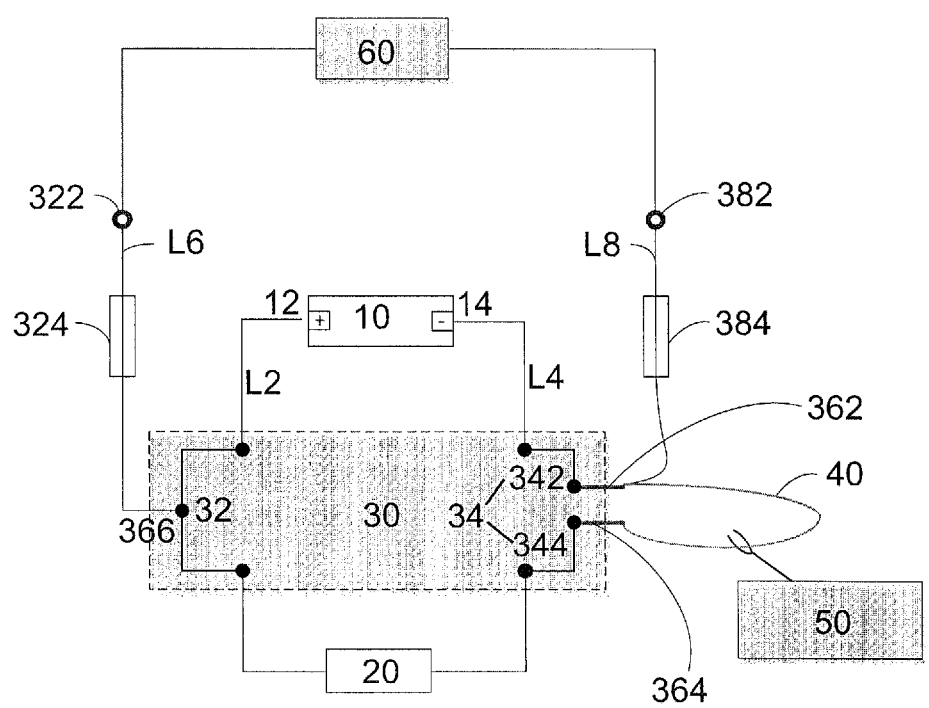
FIG. 1 is an electrical schematic diagram of testing a power battery with an MSD connector test device constructed in accordance with the principle of the present disclosure.

FIG. 1 is an electrical schematic diagram of testing a power battery with an MSD connector test device in accordance with the principle of the present disclosure.

As shown in FIG. 1, a positive terminal 12 and a negative terminal 14 of a power battery 10 are electrically connected to a load 20 via a positive conductive wire L2 and a negative conductive wire L4 respectively to form a closed electrical circuit. A positive contact 32 and a negative contact 34 of the MSD connector test device 30 of the present disclosure are electrically connected to the positive conductive wire L2 and the negative conductive wire L4, respectively.

In particular, the positive conductive wire L2 and the negative conductive wire L4, which electrically connect the power battery 10 and the load 20 are each broken into two segments. At the breakpoint, the positive contact 32 and the negative contact 34 of the test device 30 electrically link the two segments of the positive conductive wire L2 and the negative conductive wire L4 respectively. Thus, the positive terminal 12 of the power battery 10 is electrically connected to the positive node of the load 20 via the positive conductive wire L2 and the positive contact 32 of the MSD connector test device 30 positioned therein. The negative node of the load 20 is electrically connected to the negative terminal 14 of the power battery 10 via the negative conductive wire L4 and the negative contact 34 of the MSD connector test device 30 positioned therein, forming the closed electrical circuit. Therefore, a current flowing through any one of the positive contact 32 and the negative contact 34 of the MSD connector device 30 is equal to the output current of the power battery 10. In the illustrated exemplary embodiment of the present disclosure, the current flowing through the negative contact 34 of the MSD connector test device 30 is measured as the output current of the power battery 10. A voltage between the positive contact 32 and the negative contact 34 of the MSD connector test device 30 is equal to the output voltage of the power battery 10. The MSD connector test device 30 of the present disclosure is constructed according to this principle.

As shown in FIG. 1, the negative contact 34 of the MSD connector test device 30 is constructed as two separate contact portions 342 and 344, which are electrically connected to two broken segments of the negative conductive wire L4 respectively. Two negative external terminal assemblies 362 and 364 are electrically connected to the contact portions 342 and 344 respectively, and a cable 40 electrically connects the two negative external terminal assemblies 362 and 364. Thus, the contact portions 342 and 344 electrically connected via the cable 40 and the two negative external terminal assemblies 362 and 364 form the negative contact 34 that electrically reconnects the two segments of the negative conductive wire L4, and thereby closing the electrical circuit formed by the power battery 10 and the load 12.

The current in the cable 40 can be measured with an ammeter, such as a current clamp 50. In the present disclosure, the negative external terminal assemblies 362 and 364 are electrically connected via the cable 40 between the two contact portions 342 and 344 of the negative contact 34 of the MSD connector test device 30, so that the current in the closed electrical circuit flows through the cable 40. Thus, the current in the main cable 40 measured by the current clamp 50 is the current in the closed electrical circuit, i.e. the output current of the power battery 10. Since the cable 40 is positioned in the closed electrical circuit formed by the power battery 10 and the load 20, it is also referred to as a main cable.

A negative port 382 is extended out from one of the two negative external terminal assemblies 362 and 364 of the MSD connector test device 30, for example the negative external terminal assembly 362 in FIG. 1, via a negative port conductive wire L8, such as a cable. Similar to the negative external terminal assemblies 362 and 364, the MSD connector test device 30 further includes a positive external terminal 366 electrically connected to the positive contact 32 of the MSD connector test device 30, and, from the positive external terminal 366, a positive port 322 is extended out via a positive port conductive wire L6, such as a cable. A voltmeter 60 when electrically connected between the positive port 322 and the negative port 382 can measure the voltage between the positive contact 32 and the negative contact 34 of the MSD connector test device 30, i.e. the output voltage of the power battery 10.

Further, fuses 324 and 384 are provided in the positive port conductive wire L6 and the negative port conductive wire L8 respectively and are positioned between the positive and negative ports 322 and 382 accessible to the operator and the positive and negative contacts 32 and 34 of the MSD connector test device 30. In this way, when there is any short circuit due to mis-operation, the fuses can timely disconnect the electrical circuit to protect the operator.

According to one aspect of the present disclosure, one of the positive and negative contacts of the MSD connector test device 30 (the negative contact in FIG. 1) is provided as two separate contact portions which are electrically connected to the main cable via two external terminal assemblies. This allows the current in the closed electrical circuit formed by the power battery and the load to flow through the main cable so that the operator can measure the current in the main cable using a current clamp to indirectly measure the current in the closed circuit, i.e. the output current of the power battery. The positive and negative ports are electrically connected to the positive and negative contacts of the MSD connector test device 30 via the positive and negative port conductive wires, respectively, so that the voltmeter can be electrically connected by the operator between the positive and negative ports to measure the voltage between the positive and negative contacts of the MSD connector test device 30, i.e. the output voltage of the power battery. The fuses respectively provided for the positive and negative port conductive wires can disconnect the positive and negative contacts of the MSD connector test device 30 and protect the operator when there is a short circuit.

Figure 2:
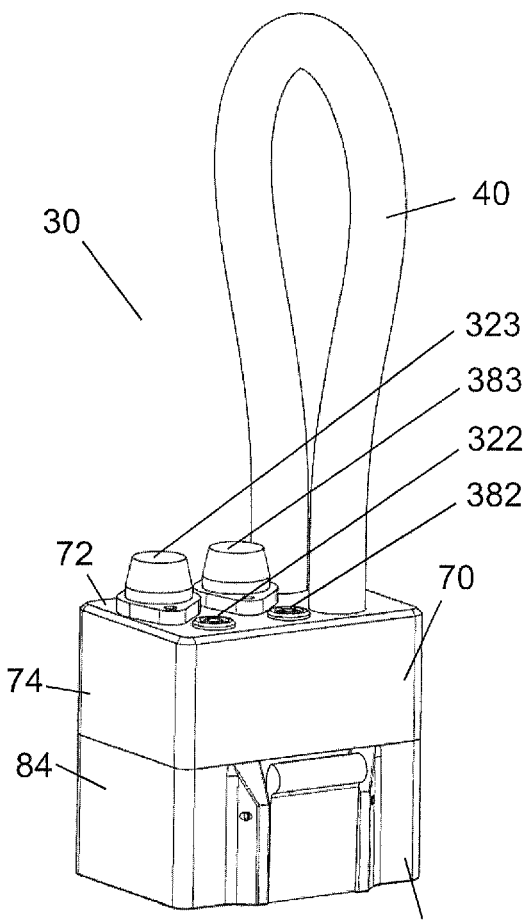
FIG. 2 is an external perspective view of an MSD connector test device modified in accordance with the principle of the present disclosure.

FIG. 2 shows an external perspective view of the MSD connector test device 30 embodiment constructed in accordance with the principle of the present disclosure. The MSD connector test device 30 in this embodiment is in the form of an integrated assembly. The output current and voltage of the power battery 10 can be easily measured using the test device 30, which is simple to operate and convenient to carry around.

Figure 4:
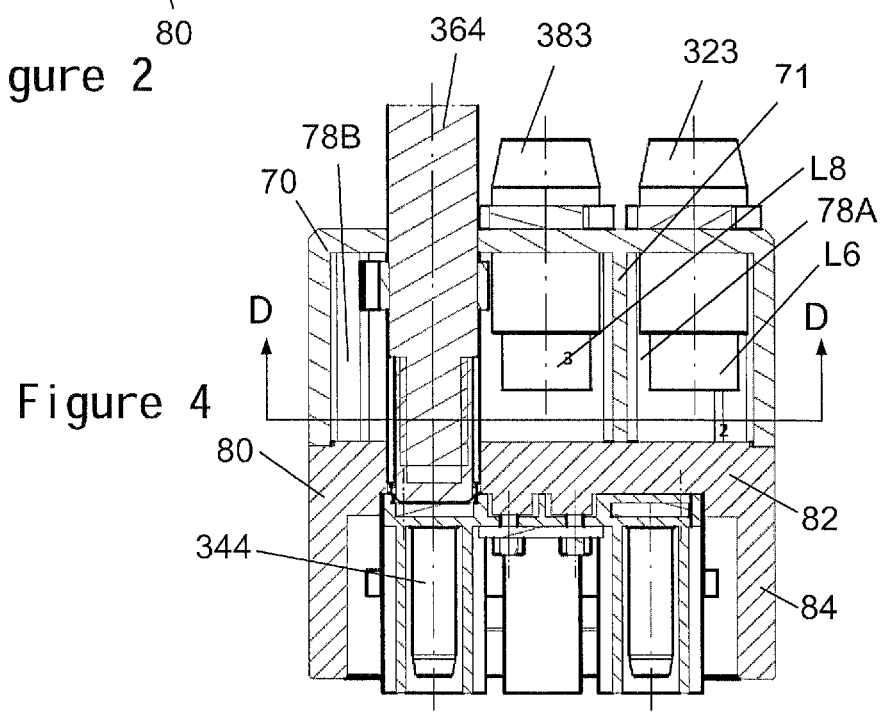
FIG. 4 is a cross-sectional view of the MSD connector test device.

In this embodiment, the MSD connector test device 30 includes an upper housing 70 and a lower housing 80, the upper housing 70 and the lower housing 80 being connected together by fasteners 75 (as shown in FIG. 6) to form an integrated test device assembly. The upper housing 70 has a generally rectangular parallelepiped configuration including a top wall 72 and peripheral side walls extending generally perpendicularly from the top wall 72, such as four side walls 74. Similarly, the lower housing 80 has a generally rectangular parallelepiped configuration having dimensions corresponding to those of the upper housing 70 and including a top wall 82 and peripheral side walls extending generally perpendicularly from the top wall 82 (as shown in FIG. 4), such as four side walls 84 (as shown in FIGS. 2 and 4). Four fasteners 75 are located at four corners of the upper and lower housings 70 and 80 (as shown in FIG. 6).

As can be seen in FIG. 2, the following components are exposed outside of the MSD connector test device 30 and extended through the upper housing 70 of the test device 30: the cable 40 for measuring the current, the positive port 322 and the negative port 382 for electrically connecting to the voltmeter 60 to measure the voltage, and the fuses 324 and 384 electrically connected to the positive port 322 and the negative port 382 (shown in the FIG. 2 are fuse holders 323 and 383 accommodating the fuses 324 and 384). This design can minimize the number of electrical components exposed outside while achieving the object of power battery test, and can protect the operator to the greatest extent and provide the advantage of convenient operation.

As shown in FIG. 2, the positive port 322 and the negative port 382 are in the form of a banana socket, which is convenient to operate and use and conforms to usage habits of public. The fuses 324 and 384 (not shown in FIG. 2) are housed in the fuse holders 323 and 383, which are easy to access and operate by the operator and easy to replace. The fuse holders 323 and 383 protect the fuses from exposure to the outside and protect the operator from being electrically shocked when there is a short circuit. The cable 40 is exposed outside of the MSD connector test device 30, through which the operator can operate the current clamp 50 conveniently to measure the current. Compared to the existing art, the main cable for measuring the current is not limited by the size of the MSD connector test device 30 and permits usage of a large-size cable with a voltage up to 400V and a current up to 250 A. In addition, the housing 70 of the MSD connector test device 30 has a small and portable size.

Figure 3:
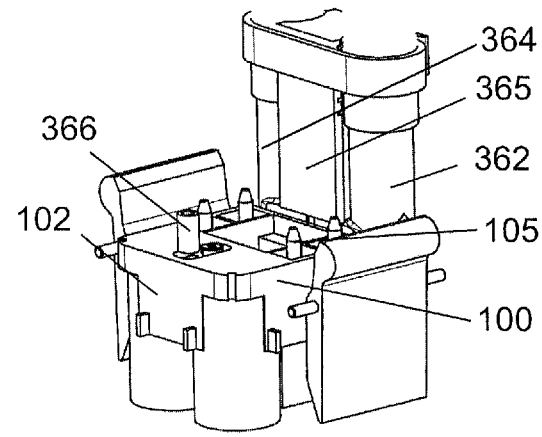
FIG. 3 is another perspective view of the MSD connector test cartridge with both upper and lower housings removed to expose an MSD connector in the MSD connector test device.

The lower housing 80 houses an MSD connector 100 therein. FIG. 3 is another schematic perspective view of the MSD connector test device 30, with the upper housing 70 and associated components as well as the lower housing 80 removed to expose the MSD connector 100 housed within the lower housing 80. FIG. 4 is a cross-sectional view through a plane in which the negative external terminal 364 is located. FIG. 5 is a cross-sectional view along a line D-D in FIG. 4.

The MSD connector 100 in one embodiment includes a connector housing 102 and the positive contact 32 and the negative contact 34 (not shown in FIGS. 3-5) housed therein. Only the connector housing 102 and the four fasteners 105 which are configured for fastening the connector housing 102 to the lower housing 80 (in particular, fastening a top wall of the connector housing 102 to the top wall 82 of the lower housing 80) are shown in FIG. 3. Alternatively, the connector housing 102 and the lower housing 80 can be constructed as an integral component.

In the connector housing 102 of the MSD connector 100, the positive external terminal 366 is mechanically fastened and electrically connected to the positive contact 32 of the MSD connector 100, and the negative external terminals 362 and 364 are mechanically fastened and electrically connected to the two separate contact portions 342 and 344 of the negative contact 34 of the MSD connector 100. FIG. 4 shows in detail the connection between the negative external terminal 364 and the corresponding contact portion 344 of the negative contact 34 of the MSD connector 100.

The positive external terminal 366, which is electrically connected with the positive contact 32 of the MSD connector 100, and the negative external terminals 362 and 364, which are electrically connected to the two contact portions 342 and 344 of the negative contact 34 of the MSD connector 100, pass through the connector housing 102 of the MSD connector 100 and through the top wall 82 of the lower housing 80 of the MSD connector test device 30, extend into a space defined by the upper housing 70, and are contained within the space defined by the upper housing 70.

In the space of the upper housing 70, the negative external terminals 362 and 364 receive respective ends of the cable 40, which is inserted from outside of the MSD connector test device 30, and are electrically connected thereto. Further, the negative port conductive wire L8 is extended out from one of the negative external terminals 362 and 364, for example, from the negative external terminal 362, the negative port conductive wire L8 being firstly electrically connected to the fuse 384 (not shown) and then terminated at the negative port 382. The positive port conductive wire L6 is extended out from the positive external terminal 366, and the positive port conductive wire L6 is firstly electrically connected to the fuse 324 (not shown) and then terminated at the positive terminal 322. Finally, as described above, the fuse holders 323 and 383 housing the fuses 324 and 384 respectively and the positive and negative ports 322 and 382 in the form of the banana jack are exposed outside of the MSD connector test device 30 through the top wall 72 of the upper housing 70.

As can be seen from FIGS. 4 and 5, the upper housing 70 includes a partition 71 that divides the space defined by the upper housing 70 into two space portions 78A and 78B. The partition 71 can be an integral part of the upper housing 70, such as a partition panel extending from the top wall 72 of the upper housing 70. For example, the partition panel can have an extending length which is substantially the same as the side wall 74, and is configured to be placed in a close contact with the top wall 82 of the lower housing 80 when the upper housing 70 and the lower housing 80 are fastened together. Alternatively, the partition panel 71 may be a separate component that is formed separately from the upper housing 70 and assembled in the space. In the present disclosure, all components associated with a positive pole are disposed in or pass through the space portion 78A, and all components associated with a negative pole are disposed in or pass through the space portion 78B. This design physically separates parts associated with the positive pole and parts associated with the negative pole from each other in the test device, and avoids short circuit between the positive and negative poles in the test device.

FIG. 6 shows a schematic view with the upper housing 70 and associated components removed.

The MSD connector test device 30 of the present disclosure in another embodiment further includes a structure that prevents the cable 40 from being accidentally pulled out of the test device 30. In particular, as also shown in FIGS. 3, 5 and 6, in the negative space portion 78B of the upper housing 70, the negative external terminals 362 and 364 are insulated from each other by an insulating portion, such as an insulating block 365, and the respective ends of the cable 40 connected to the negative external terminals 362 and 364 are insulated from each other by the same. The insulating block 365 includes a toothed structure on its surfaces in contact with the cable 40 that is capable of engaging an outer insulation layer of the cable 40, and the cable 40 and the insulating block 365 are tied together using a binding device, such as a strap 367. With the upper housing 70 assembled, the cable 40 is bound to the insulating block 365 tightly by the strap 367 within the space defined by the upper housing 70, preventing the cable 40 from being accidentally pulled out of or detached from the test device 30. It will be understood by those skilled in the art that the interaction between the insulating block 365 and the cable 40 can be achieved by any structure, which is not limited to the above-described toothed structure.

FIG. 7 is a detailed structural illustration, which shows an embodiment of the fastening and electrical connection between the external terminals 362, 364 and 366 and the corresponding contacts or contact portions 32, 34, 342 and 344 of the MSD connector. This applies to the connection of both positive and negative external terminals to the corresponding contacts.

As shown, the external terminal includes a socket portion, such as a cylindrical socket portion 212, and a connecting portion 214, which are integrally formed or separately formed and then attached together. The contact or contact portion of the MSD connector 100 includes a rod portion 222 and a connecting portion 224 that are integrally formed or separately formed and then attached together. In the illustrated embodiment, the connecting portion 214 of the external terminal and the connecting portion 224 of the contact or contact portion of the MSD connector 100 are both plate-shaped, and the two are connected together in any suitable manner, for example, any one or more of: bolting, welding, crimping, riveting, interference fit, and the like. In the illustrated embodiment, a combination of bolting and welding is applied, and bolts 215 for connecting the two connecting portions are shown. In this way, safety and reliability of the electrical connection between the external terminal and the contact is ensured. In addition, FIG. 7 is merely to illustrate one way in which the external terminal is connected to the corresponding contact, and is not intended to limit the structure of the external terminal and the contact. For example, the external terminal is not limited to the illustrated socket structure, and the contact is not limited to the illustrated columnar structure.

FIG. 8 illustrates the integrated MSD connector test device 30 is connected to an MSD socket in the car in accordance with one embodiment of the present disclosure. The MSD socket is placed at the breakpoint of the positive conductive wire L2 and the negative conductive wire L4, which are electrically connected to the positive and negative of the power battery 10. When the integrated MSD connector test device 30 is mounted to the MSD socket, the positive contact 32 and the two contact portions 342 and 344 of the negative contact 34 of the MSD connector test device 30 close the electrical circuit formed by the power battery 10 and the load 20.

As shown in FIG. 8, the MSD connector test device 30 is mounted to the MSD socket, and a portion (side wall 122) of a housing of the MSD socket is placed between the side wall 84 of the lower housing 80 of the MSD connector test device 30 and a side wall of the connector housing 102 of the MSD connector 100.

For securely connecting the integrated MSD connector test device 30 with the MSD socket, the housing of the MSD connector test device 30 (in particular, but not necessarily, the side wall of the lower housing 80) and the housing of the MSD socket are provided with complementary locking features, respectively, which can be releasably locked. Any structure suitable for achieving this function can be used in accordance with the principle of the present disclosure.

In the example given in FIG. 8, the locking feature of the MSD connector test device 30 includes a pivot shaft 232 that is fixed or attached to the lower housing 80 of the MSD connector test device 30, a pivot member 234 supported by and rotatable around the pivot shaft 232, and a locking portion 236 formed on the pivot member 234. A resilient member 238 has one end that is fixed to the lower housing 80 or received in a recess 81 formed in the lower housing 80 as shown, and the other end that is urged against an actuating end of the pivot member 232, the actuating end and the locking portion 236 of the pivot member 234 being located at opposite sides of the pivot shaft 232.

Accordingly, the side wall 122 which is inserted in the lower housing 80 of the MSD connector test device 30 includes a complementary locking portion 136 for releasably and lockably engaging the locking portion 236. The locking portion 236 and the complementary locking portion 136 can be in the form of a recess and a projection as shown, or can be in the form of a projection and a recess on the contrary. It should be appreciated for those skilled in the art that any other shape and size of complementary structures can be utilized as the locking portion 236 and the complementary locking portion 136 other than the illustrated structures.

FIG. 8 shows that the resilient member 238 is in an initial uncompressed state with no external force applied, wherein the locking portion 236 of the pivoting member 234 and the complementary locking portion 136 of the MSD socket are locked to each other under a urging force of the resilient member 238, and therefore the MSD connector test device 30 is locked via its the lower housing 80 to the MSD socket. When the operator pushes the actuating end of the pivoting member 234 manually against the urging force of the resilient member 238, the resilient member 238 is compressed, the pivoting member 234 pivots around the pivot shaft 232, and the locking portion 236 of the pivoting member 234 and the complementary locking portion 136 of the MSD socket is disengaged from each other, allowing the lower housing 80 of the MSD connector test device 30 to be removed from the MSD socket, and thereby breaking the electrical connection to the power battery 10.

Advantageously, the actuating end of the pivot member 234 is provided with an out-protruding portion 235 that facilitates manual application of a removal force. As shown in FIG. 9, the out-protruding portion 235 is circular or arc or any other curved protruding portion. The structure of the out-protruding portion is ergonomic such that, when the operator intends to operate the actuating end and apply a force to it to remove the test device 30 from the MSD socket, the removal force F has a horizontal force component FX for compressing a spring and an upward force component FY that can be applied easily and conveniently to unlock the complementary locking structures of the test device 30 and the MSD socket, facilitating the removal of the test device 30.

The specific embodiments are described as above with reference to the accompanying drawings, but they are presented by way of example only, and are not intended to limit the protecting scope of the invention. Rather, the structures described herein can be embodied in many other forms. Various substitutions and modifications can be made to the above-described embodiments by those skilled in the art without departing from the spirit and scope of the invention defined by the claims.

The invention claimed is:

1. An integrated test device for performing a power battery test, the integrated test device comprising:
   a housing comprises an upper housing and a lower housing;
   Manual Service Disconnect (MSD) connector housed in the lower housing and having a connector housing and a first polarity contact and a second polarity contact configured to be connected to first and second polarity terminals of a power battery under test via first and second wires, wherein the second polarity contact comprises two contact portions separated from each other;
   a cable for testing a current of the power battery extending at least partially outside of the housing, and electrically connected between the two contact portions of the second polarity contact; and
   a first polarity port and a second polarity port for testing a voltage of the power battery accessible from outside of the housing, the first polarity port being electrically connected to the first polarity contact and the second polarity port being electrically connected to one of the two contact portions of the second polarity contact,
   wherein the first polarity port and the second polarity port are connected to a voltage measuring device;
   wherein the first polarity is a positive or negative, and correspondingly, the second polarity is a negative or positive.

2. The integrated test device according to claim 1, further comprising a first polarity external terminal and a second polarity external terminal housed in the housing, wherein:
the first polarity external terminal is electrically connected between the first polarity contact and the first polarity port so that the two are electrically connected to each other, and the second polarity external terminal is electrically connected between the one of the two contact portions and the second polarity port so that the two are electrically connected to each other.

3. The integrated test device according to claim 2, wherein one or more fuses are provided between the first polarity port and the first polarity external terminal and between the second polarity port and the second polarity external terminal.

4. The integrated test device according to claim 3, further comprising one or more fuse holders that house the respective fuses, the fuse holders being at least partially exposed outside of the housing.

5. The integrated test device according to claim 4, wherein the upper housing and the lower housing detachably connected to each other and the connector housing of the MSD connector is fastened to the lower housing.

6. The integrated test device according to claim 5, wherein an electrical connection between the first polarity external terminal and the first polarity contact and an electrical connection between the second polarity external terminal and the respective contact portion are within the lower housing.

7. The integrated test device according to claim 5, wherein the first polarity external terminal and the second polarity external terminal extend from the lower housing into the upper housing, a first polarity conductive wire and a second polarity conductive wire are located in the upper housing, and the first polarity port, the second polarity port and the fuses at least partially extend out from the upper housing to the outside.

8. The integrated test device according to claim 5, wherein an insulating block is interposed in the housing and is configured to engage and secure the cable in the housing.

9. The integrated test device according to claim 8, wherein the insulating block comprises a toothed structure for engaging an outer surface of the cable.

10. The integrated test device according to claim 8, further comprising a binding structure that secures the cable to the insulating block.

11. The integrated test device according to claim 10, wherein the binding structure is a strap.

12. The integrated test device according to claim 5, wherein the upper housing comprises a partition that defines a first space portion for the first polarity and a second space portion for the second polarity that is spaced apart from the first space portion, and wherein the first polarity external terminal, the first polarity port, and the fuse therebetween are placed in the first space portion, and the second polarity external terminal, the second polarity port and the fuse therebetween are placed in the second space portion.

13. The integrated test device according to claim 2, wherein an electrical connection between the first polarity external terminal and the first polarity contact and an electrical connection between the second polarity external terminal and the corresponding contact portion are achieved by one or more of: bolting, welding, riveting, interference fit and crimping.

14. The integrated test device according to claim 13, wherein the first polarity external terminal and the first polarity contact each comprise a plate-shaped connecting portion, and these plate-shaped connecting portions are bolted and welded together; and
the second polarity external terminal and the corresponding contact portion each comprise a plate-shaped connecting portion, and these plate-shaped connecting portions are bolted and welded together.

15. The integrated test device according to claim 1, further comprising a locking feature for releasably securing the integrated test device to an MSD socket of the power battery.

16. The integrated test device according to claim 15, wherein the locking feature is a protrusion or recess formed on the lower housing of the integrated test device, which is configured for engaging a recess or a projection formed on the MSD socket.

17. The integrated test device according to claim 16, further comprising a pivot shaft supported by the lower housing, a pivot member pivotable around the pivot shaft, and a resilient member positioned between an actuation end of the pivot member and the lower housing, wherein the protrusion or recess is disposed on the pivot member, and the protrusion or recess is configured to engage the recess or protrusion on the MSD socket when the resilient member is in an uncompressed state.

18. The integrated test device according to claim 17, wherein the pivot member comprises an out-protruding portion at its actuation end.

* * * * *